United States Patent [19]
Budil et al.

[11] Patent Number: 6,101,015
[45] Date of Patent: Aug. 8, 2000

[54] VARIABLE-COUPLING QUASIOPTICAL ELECTRON RESONANCE APPARATUS

[75] Inventors: David E. Budil, Stoughton, Mass.; Keith A. Earle; Jack H. Freed, both of Ithaca, N.Y.; James R. Anderson, Chicago, Ill.

[73] Assignee: Northeastern University, Boston, Mass.

[21] Appl. No.: 08/954,904

[22] Filed: Oct. 21, 1997

Related U.S. Application Data

[60] Provisional application No. 60/029,579, Oct. 22, 1996.

[51] Int. Cl.[7] .................................................. H04B 10/12
[52] U.S. Cl. ........................ 359/173; 359/173; 324/316
[58] Field of Search ................... 385/27, 50, 72; 350/356; 356/352, 437; 324/316; 333/166; 359/173

[56] References Cited

U.S. PATENT DOCUMENTS

| | | | |
|---|---|---|---|
| 3,798,532 | 3/1974 | Hausser | 324/5 |
| 4,765,179 | 8/1988 | Fuller et al. | 73/53 |
| 4,887,037 | 12/1989 | Yajima et al. | 324/316 |
| 4,998,255 | 3/1991 | Gerstenberger et al. | 372/28 |
| 5,027,435 | 6/1991 | Chraplyvy et al. | 455/617 |
| 5,302,898 | 4/1994 | Pethig et al. | 324/316 |

*Primary Examiner*—Christine K. Oda
*Assistant Examiner*—Brij B. Shrivastav
*Attorney, Agent, or Firm*—Weingarten, Schurgin, Gagnebin & Hayes LLP

[57] ABSTRACT

A variable-coupling quasioptical electron paramagnetic resonance apparatus. In one embodiment, the variable-coupling quasioptical electron paramagnetic resonance apparatus includes a variable coupling quasioptical resonance cavity constructed from two back-to-back Fabry-Perot interferometers. One Fabry-Perot interferometer is formed from two partially reflecting mirrors. The second Fabry-Perot interferometer is an interferometer formed from one of the partially reflecting mirrors and a back mirror. A sample to be studied is placed within the cavity adjacent the partially reflecting mirrors and between one of the partially reflecting mirrors and the back mirror. The relative spacing of the partially reflecting mirrors and the back mirror is adjustable. With this arrangement, the interferometer can be made to act as a single mirror with variable reflectivity, thereby permitting incident radiation reaching the sample to be varied precisely and continuously.

43 Claims, 8 Drawing Sheets

VARIABLE-COUPLING QUASIOPTICAL ELECTRON RESONANCE APPARATUS

CROSS REFERENCE TO RELATED APPLICATIONS

This application claims priority under 35 U.S.C. § 119(e) to U.S. Provisional Patent Application Ser. No. 60/029,579, filed Oct. 22, 1996, the disclosure of which is incorporated herein by reference.

STATEMENT REGARDING FEDERALLY SPONSORED RESEARCH OR DEVELOPMENT

Part of the work leading to this invention was made with United States Government funds. Therefore, the U.S. Government has certain rights in this invention.

BACKGROUND OF THE INVENTION

Electron magnetic resonance (EMR) spectrometers, also known as electron spin resonance (ESR) or electron paramagnetic resonance (EPR) spectrometers, provide an indication of the chemical environment of electrons in a material by measuring the absorption of electromagnetic radiation, typically at microwave wavelengths, by the material when the material is placed in a magnetic field. An absorption measurement is made by sweeping the frequency of the incident electromagnetic radiation, by sweeping the strength of the magnetic field, or by pulsing the incident electromagnetic radiation and measuring the transient response of the sample.

Presently available EMR spectrometers operate generally at incident electromagnetic frequencies of 94 GHz or less. When higher frequencies are employed, the required reduction in waveguide size results in higher electromagnetic transmission losses and increased difficulties in fabricating the sample cavity due to the relative tolerances for smaller devices. To overcome these problems high frequency EMR spectrometers have been designed which include a single adjustable dimension semiconfocal Fabry-Perot interferometer as a sample cavity. However, such cavities do not permit the coupling of radiation into the sample cavity to be adjusted.

Because of this inability to vary the coupling of radiation into the sample cavity, the "finesse" or cavity amplification (a function of the ratio of power stored in the cavity to incident power) is reduced in order to accommodate a wide range of sample characteristics. That is, the overall Q of the system is given by the expression:

$$\frac{1}{Q_{overall}} = \frac{1}{Q_{unloaded}} + \frac{1}{Q_{sample}}$$

where $Q_{unloaded}$ is the Q of the cavity without the sample and $Q_{sample}$ is the contribution to $Q_{overall}$ by the sample. Although it is desirable to have a large $Q_{overall}$, the dominant term in present devices is the $1/Q_{unloaded}$, making the contribution due to $Q_{sample}$ typically small. This reduction in finesse results in a reduction in spectrometer sensitivity.

The present invention avoids these difficulties in high frequency EMR spectrometers.

BRIEF SUMMARY OF THE INVENTION

The invention relates to a variable-coupling quasioptical electron paramagnetic resonance apparatus and method of operation. In one embodiment, the variable-coupling quasioptical electron paramagnetic resonance apparatus includes a variable coupling quasioptical resonance cavity constructed from two back-to-back Fabry-Perot interferometers. One Fabry-Perot interferometer is formed by a pair of planar partially reflecting mirrors. The second Fabry-Perot interferometer is a semiconfocal interferometer formed from one of the planar partially reflecting mirrors and the concave surface of a totally reflecting back mirror.

A sample to be studied is placed within the semiconfocal cavity near the planar partially reflecting mirror of the second Fabry-Perot interferometer. By adjusting the relative placement of the mirrors which make up the cavity, the amount of energy within the cavity may be varied. With this arrangement, the semiconfocal interferometer can be made to act as a single mirror with variable reflectivity, thereby permitting input radiation incident upon the sample to be varied precisely and continuously.

In one embodiment, the planar partially reflecting mirrors enclose one end of a source waveguide. Similarly, the back mirror encloses one end of a detector waveguide. The detector waveguide is located within and coaxial with a sample guide. The sample guide has a sample chamber at one end. The waveguides and sample guide are constructed so as to permit each to move independently of the other thereby permitting the spatial relationships between the sample chamber, the planar partially reflecting mirrors and the back mirror to be varied.

The interferometer consisting of the two partially reflecting mirrors can be treated as a single mirror having an adjustable reflectance. By properly adjusting the relative positions of the partially reflective mirrors and the back mirror and by choosing the proper reflectivity for the back mirror and the reflectance of the planar mirror Fabry-Perot interferometer, a resonance cavity is created about the sample holder. The resonant cavity therefore causes the sample to be exposed to an increased electromagnetic field intensity without requiring an increase in the output power of the microwave generator.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

In overview and referring to FIGS. 1A–1E, a variable-coupling quasioptical sample cavity 10 of an electron resonance spectrometer 12, in one embodiment, includes a stationary alignment tube 14 disposed within the room temperature bore of a cryostat 38. Located within the alignment tube 14 is a sample support tube 19 and a flat mirror support tube 18, the sample support tube 19 having a removable sample support section 90. To place a sample to be measured within the sample cavity of the electron resonance spectrometer 12, the sample support tube 19 is removed from the spectrometer 12. The sample support section 90 is detached from the sample support tube 19, which also houses field modulation coils 66a and 66b, and a retaining ring 210. The retaining ring 210 is removed in order to separate the sample support section 90 from the sample support tube 19. The sample to be measured is installed by placing the sample within the appropriate type of sample holder 92, of which five different types are shown in FIGS. 3A–3E. The sample holder 92 is then installed within the sample support section 90 which is secured to the sample support tube 19 by reinsertion of the retaining ring 210, and the sample support tube 19 is reinserted into the spectrometer 12. Also located within the alignment tube 14 are a detector waveguide tube 22, a coupling mirror support tube 26, and a source waveguide tube 30. Note that the term waveguide as used in this application encompasses both microwave and quasioptical waveguides.

Figure 1A:
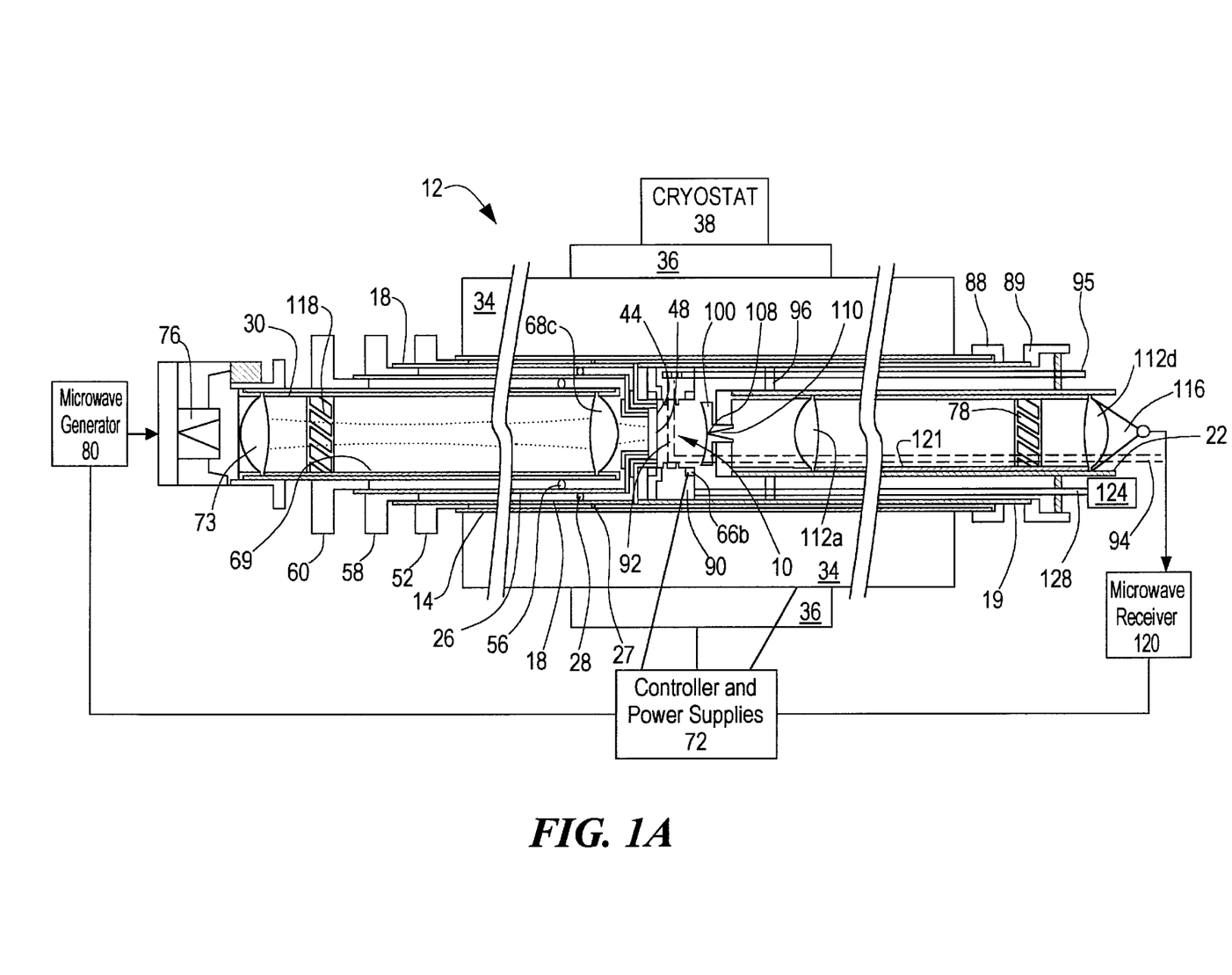
FIG. 1A is a cross-sectional diagram of a variable-coupling quasioptical electron resonance apparatus of the present invention.

The alignment tube 14 is constructed of a non-conducting, non-magnetic and thermally insulating material such as a fiberglass resin. Concentric with the axis of the alignment tube 14 and positioned approximately midway along the alignment tube 14, within the cryostat 38, is a main electromagnetic coil 34, cooled with a cryogenic liquid such as liquid helium from the cryostat 38. Concentric with and external to the main magnetic coil 34 is a sweep coil 36. The main magnetic coil 34 is constructed to generate a fixed magnetic field within the spectrometer 12 of approximately 7.9 Tesla (T). The sweep coil 36 is constructed to generate a sweepable field which is superimposed upon the field generated by the main magnetic coil 34. In one embodiment, the sweepable field is swept over its range of ±0.05 T in three seconds under the control of a controller 72, to be discussed subsequently.

The flat mirror support tube 18 extends from one end of, and is positioned and movable within, the alignment tube 14.

In one embodiment, the flat mirror support tube 18 is maintained concentric with and movable within the alignment tube 14 by a non-magnetic, substantially frictionless ring 27. The coupling mirror support tube 26 extends from one end of, and is positioned and movable within, the flat mirror support tube 18. In one embodiment, the coupling mirror support tube 26 is maintained concentric with and movable within the flat mirror support tube 18 by a non-magnetic, substantially frictionless ring 28. Other embodiments utilize other methods, such as non-magnetic bearings, to maintain the coupling mirror support tube 26 movably concentric within the sample support tube 19 and the sample support tube 19 movably concentric within the alignment tube 14.

The coupling mirror support tube 26 is closed at one end by a first planar partially reflecting mirror 48 (hereinafter the cavity flat mirror). The flat mirror support tube 18 is closed at one end by a second planar partially reflecting mirror 44 (hereinafter the coupling mirror). Each of these planar partially reflecting mirrors 44 and 48 are non-polarizing and are constructed from a fine metallic mesh, such as gold, silver, copper or nickel; from a partially metallized dielectric, such as mylar, teflon, quartz, polymethyl pentene, polystyrene or sapphire; or from an inverse metallic mesh deposited on a dielectric.

Figure 1B:
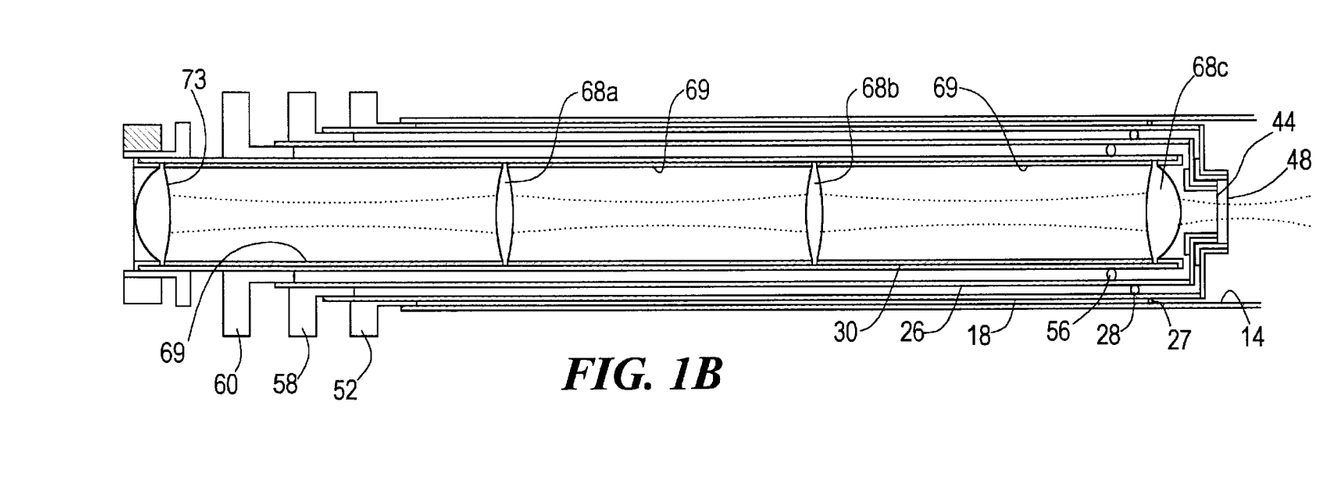
FIG. 1B is a cross-sectional diagram of a side of the apparatus of FIG. 1A nearest a millimeter-wave source.
Figure 1C:
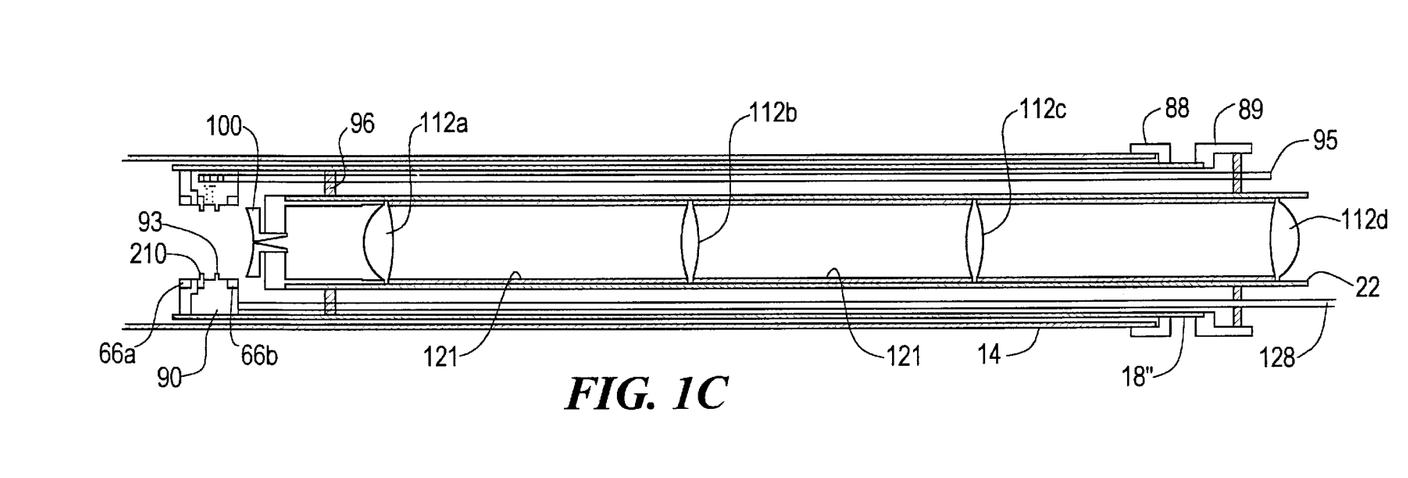
FIG. 1C is a cross-sectional diagram of a side of the apparatus of FIG. 1A nearest a millimeter-wave detector for operation in transmission mode.
Figure 1D:
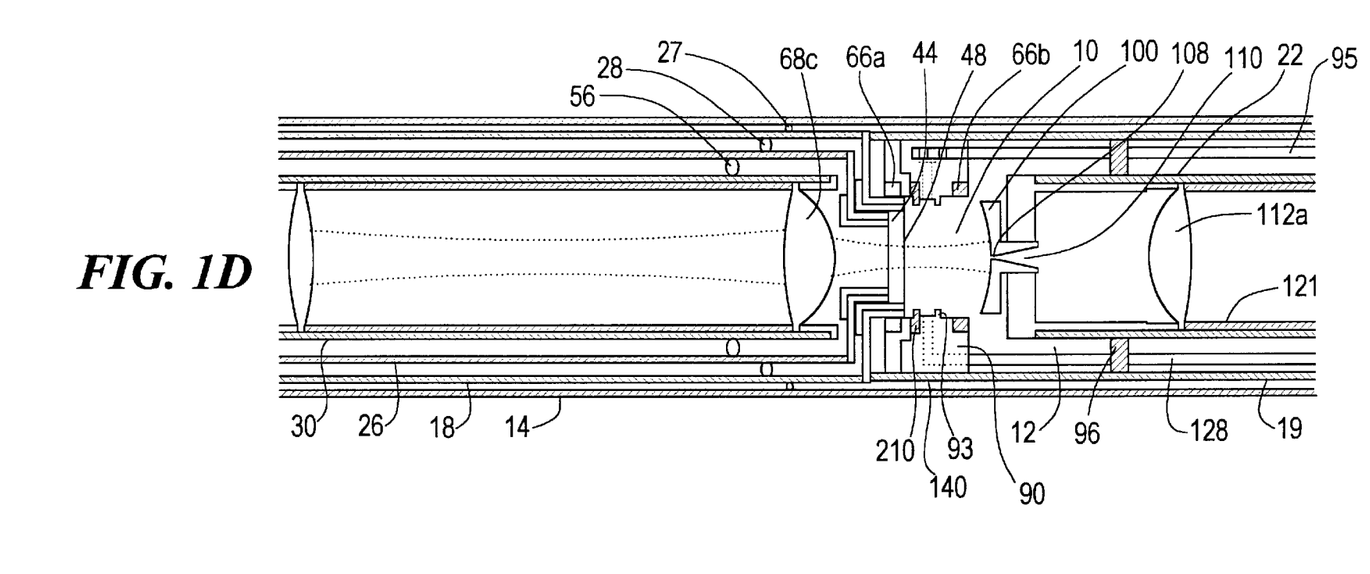
FIG. 1D is a cross-sectional diagram of a sample chamber of the apparatus of FIG. 1A.
Figure 1E:
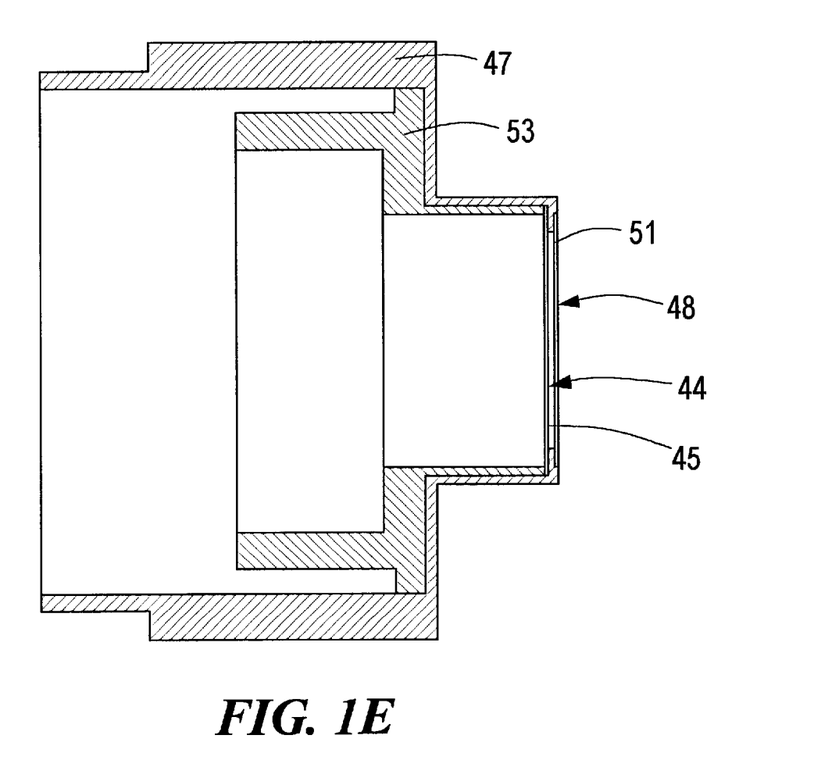
FIG. 1E is a cross-sectional side view of the planar partially reflecting mirrors of the sample chamber of FIG. 1D.
Figure 1F:
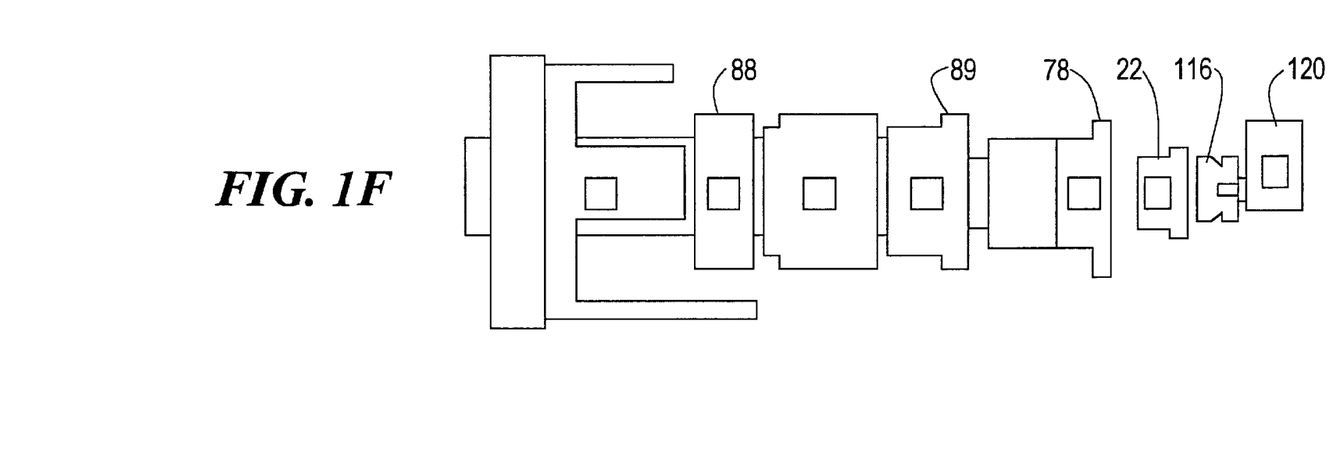
FIG. 1F is a diagram of a mount for a millimeter-wave detector when the apparatus is operated in transmission mode.

The suspension of a first embodiment of the partially reflecting mirrors 44 and 48 is illustrated in FIG. 1E. The cavity flat mirror 48 consists of a metallic mesh (inductive) or an inverse mesh (capacitive) affixed to a cylindrical support collar 47 with a cylindrical threaded insert sleeve (not shown). A dielectric window 51 of appropriate thickness to minimize interference effects is disposed between the threaded insert sleeve and the metallic mesh such that the insert may be turned to maintain the mirror material taut against the window 51. The coupling mirror 44 mesh is similarly disposed by affixing it to a cylindrical support collar 53 and using a threaded sleeve to turn a dielectric window of appropriate thickness 45 to maintain the mirror material taut against the window 45. In an alternate embodiment the mirror material may be deposited directly on the dielectric windows 51 and 45 the windows may be affixed directly to the support collars 47 and 53 without the use of threaded sleeves 49 and 55.

Referring back to FIG. 1A, the closed end of the coupling mirror support tube 26 is positioned within the central region of the main electromagnetic coil 34 within the alignment tube 14, as is the cavity mirror support tube 18. The open end of the flat mirror support tube 18 includes a cavity mirror adjustment ring 52 which is movably attached to the alignment tube 14. The cavity mirror adjustment ring 52 permits the position of the cavity flat mirror 48 to be adjusted within the alignment tube 14 with a high degree of accuracy and maintained in that position. The open end of the coupling mirror support tube 26 includes a coupling mirror adjustment ring 58 which is movably attached to the coupling mirror support tube 26. The coupling mirror adjustment ring 58 permits the position of the coupling mirror 44 to be adjusted within the coupling mirror support tube 26 with a high degree of accuracy and maintained in that position. Other methods of finely adjusting the position of the partially reflecting mirrors 44, 48, such as a fine pitch rack and pinion arrangement, are contemplated.

The source waveguide tube 30 extends, within the coupling mirror support tube 26, from one end of the coupling mirror support tube 26 toward the partially reflecting mirrors 44, 48. The source waveguide tube 30, in one embodiment is made of an insulating fiberglass epoxy. In another embodiment, the source waveguide tube 30 is made of a non-magnetic metal having a low coefficient of thermal expansion. The source waveguide tube 30 is movable within and maintained coaxial with the coupling mirror support tube 26 by a dielectric ring 56 positioned between the source waveguide tube 30 and the coupling mirror support tube 26. The coupling mirror support tube 26 is movable within and maintained coaxial with the flat mirror support tube 18 by a dielectric ring 28 positioned between the cavity flat mirror support tube 18 and the coupling mirror support tube 26. The cavity flat mirror support tube 18 is movable within and maintained coaxial with the alignment tube 14 by a dielectric ring 27 positioned between the cavity flat mirror support tube 18 and the alignment tube 14.

The end of the source waveguide tube 30 extends from the coupling mirror support tube 26 and includes a source waveguide adjustment ring 60. As with the coupling mirror adjustment ring 58, this differentially threaded configuration permits the source waveguide tube 30 to be moved axially within the coupling mirror support tube 26 toward or away from the central region of the main electromagnetic coil 34.

A closed end of the coupling mirror support tube 26 proximate to the central region of the main electromagnetic coil 34 is closed by the coupling mirror 44. A closed end of the cavity flat mirror support tube 18 proximate the central region of the main electromagnetic coil 34 is closed by the cavity flat mirror 48. Relocation of the flat mirror support tube 18 by adjustment of the coupling mirror adjustment ring 58 thus causes translation of the cavity flat mirror 48 relative to the coupling mirror 44 allowing the transmission of millimeter-wave radiation through the two mirrors to be varied interferometrically. Since the coupling mirror support tube 26 is adjustably disposed within the cavity flat mirror support tube 18, adjustment of the latter via manipulation of the cavity mirror adjustment ring 52 causes relocation of both the coupling mirror support tube 26 and the cavity flat mirror support tube 18, as well as both the first and second partially reflective mirrors 44, 48, relative to the central region of the main electromagnetic coil 34.

A number of symmetric propagation lenses and/or asymmetric coupling lenses (generally 68), made from a dielectric such as teflon, high-density polyethylene (HDPE) or polymethylpentene (TPX) are positioned within the source waveguide tube 30. The coupling lenses 68 within the source waveguide tube 30 are held at a fixed distance from each other by a series of spacers 69. In one embodiment, the end of the source waveguide tube 30 which extends from the coupling mirror support tube 26 is closed by an entrance lens 73 adjacent to a horn antenna 76. In one embodiment, the horn antenna 76 is a scalar horn antenna which produces a good match between the source waveguide and the entrance lens. The entrance lens 73 used with the horn antenna 76 is an asymmetrical dielectric lens (unlike the symmetric dielectric propagation lenses 68), oriented with its more convex, hyperboloidal side toward the horn antenna. In another embodiment, a conventional antenna such as a dipole antenna is used and the entrance lens 73 is not required.

The source waveguide tube 30 acts as a waveguide for the microwaves launched by the antenna 76. The antenna 76 is electrically connected to a microwave generator 80 controlled by controller 72. By properly choosing the combination of the antenna 76 and waveguide, as described below, the insertion losses of the signal into the source waveguide may be reduced.

In an additional embodiment, the coupling lenses 68 are replaced by a length of corrugated cylindrical waveguide with the depth and spacing of the corrugations selected so as to minimize transmission losses at the desired wavelength.

The sample support tube 19 is located within and coaxial with the alignment tube 14. The sample support tube 19 is held coaxial with, and in a fixed position with respect to the alignment tube 14 by a stop ring 89 and is fastened inside the alignment tube 14. The stop ring ensures the repeatability of sample positioning within the region of maximum field homogeneity of the main electromagnetic coil 34. In one embodiment, the sample support tube 19 extends along the alignment tube 14 in a direction opposite to the coupling mirror support tube 26. Other embodiments, such as where the sample support tube 19 is positioned over the coupling mirror support tube 26, are contemplated.

The sample support tube 19 is provided at the end proximate to the center of the main magnet coil 34 with a sample support collar 90 which also supports the modulation coil. Protruding from an inner surface thereof are a sample stop flange 93 and the retaining ring 210. The sample stop flange 93 prevents other elements from physically impacting the sample. The retaining ring 210 serves to hold a sample holder 92, in the aperture of which the sample to be analyzed is deposited, in a desired position within the cavity 10. Exemplary sample holders 92 are illustrated in FIGS. 3A–3E.

Figure 3A:
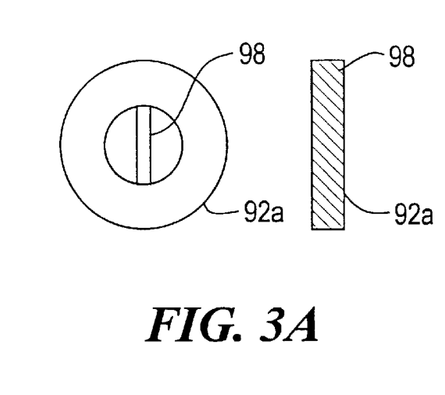
FIG. 3A is a diagram of an embodiment of a capillary sample holder used in the apparatus of FIG. 1A.
Figure 3B:
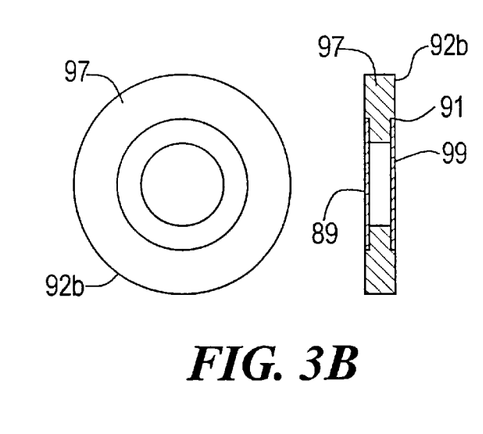
FIG. 3B is a diagram of an embodiment of a fluid sample holder used in the apparatus of FIG. 1A.
Figure 3C:
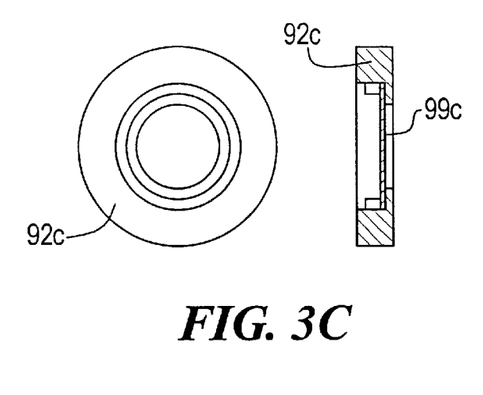
FIG. 3C is a diagram of an embodiment of a film/membrane sample holder used in the apparatus of FIG. 1A.
Figure 3D:
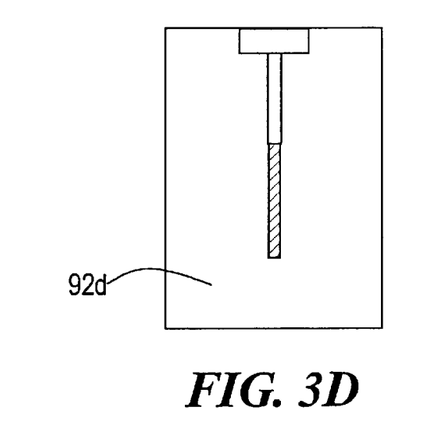
FIG. 3D is a diagram of an embodiment of a dielectric tube sample holder used in the apparatus of FIG. 1A.
Figure 3E:
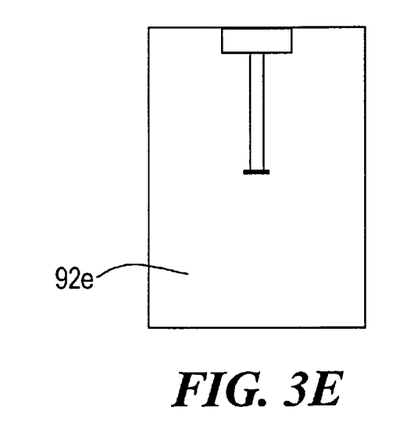
FIG. 3E is a diagram of an embodiment of a dielectric support rod sample holder used in the apparatus of FIG. 1A.

The holder 92 of FIG. 3A is referred to as a tube holder 92a, wherein the sample is deposited within a small diameter bore 98 across the aperture of the holder 92. The holder 92 of FIG. 3B is referred to as a liquid holder 92b having a first window 89, a second window 99 and having notches 91 for accepting the sample. Liquid samples are introduced through a port 97 in the side of the holder 92 which may be sealed with a stopper or septum. For samples with particularly high scattering properties or samples with particularly high dielectric losses, the window 89 may be made partially reflective so that it can function as one of the cavity flat mirrors. The holder 92 at FIG. 3C is referred to as a flat tissue cell holder 92C in which is placed a window 99c upon which tissue or membrane samples may be deposited. The window 99c is held in the flat tissue sample holder 92c. The sample may also be held in a dielectric tube 92d as shown in FIG. 3D or mounted on a dielectric support rod 92e mounted to the sample collar by analogy with conventional EMR spectroscopy as shown in FIG. 3E. Further embodiments, which are not illustrated, include various combinations of the foregoing holders.

Referring back to FIG. 1A, the orientation of the tube or rod sample holders is adjustable by a control rod 95 which extends from the adjustment ring 89 end of the sample support tube 19. Two cooling gas tubes 94 and 94a (not shown), which move with the sample support tube 19, provide for cooling and exhaust of the sample holder 92.

Also adjacent and attached to the sample holder 92 when installed is a set of modulation coils (generally 66). In a first embodiment, the coils are implemented as a pair of Helmholtz coils capable of providing a ±0.005 T field at 5–100 KHz. One coil 66a, 66b is positioned on each side of the sample holder 92. The operation of these coils is also controlled by controller 72. These modulation coils 66 modulate the resonance field provided by the main magnetic coil 34 and the sweep coil 36 at the sample holder 92. The modulation coils 66 are positioned such that the distance between the coils 66a and 66b is equal to the radius of each coil to optimize the homogeneity of the modulation field. The radius is constructed as large as possible to permit the partially reflective mirrors 44, 48 to approach the sample holder 92, yet small enough to be positioned sufficiently away from the walls of the magnet cryostat bore to avoid eddy current loss.

In a further embodiment, the modulation coils 66 are solenoid coils. However, such solenoid coils block lateral entry of samples, cooling gas, light, or mounting structures from an exterior surface of the cavity 10, and provide a weaker field due to their geometry.

Within and coaxial with the sample support tube 19 is the detector waveguide tube 22. The detector waveguide tube 22 is maintained coaxial with and moveable within the sample support tube 19 by a dielectric ring 96. The end of the detector waveguide tube 22 which is positioned within the sample support tube 19 is closed by a back mirror 100 which is concave toward the sample holder 92. The back mirror 100 includes a beam aperture 108 which opens into a smooth, conical horn 110. The aperture 108 is large enough to support the TEM 001 mode for microwave transmission, yet small enough not to affect the reflectivity of the mirror 100 significantly. Located adjacent to the conical horn 110 is the first of a series of symmetric dielectric lenses 112(a–d) which direct the microwave energy beam from the conical horn 110 down the detector waveguide tube 22 to a horn antenna 116 connected to a waveguide mounted receiver 120. As in the source waveguide tube 30, the lenses 112 in the detector waveguide tube 22 are held at a fixed distance from each other by spacers 121.

A light source 124 and light pipe 128 which move with the sample support tube 19 provide illumination for the sample. This is particularly useful in the study of light-induced radicals. An adjustment ring 89 adjusts and maintains the location of the detector waveguide tube 22 and the back mirror 100 relative to the sample holder 92.

In one embodiment, an uncoated dielectric quarter wave plate 118 is positioned at a fixed orientation with respect to the source in the source waveguide tube 30 after the source antenna 76, and another quarter wave plate 78 is positioned in the detector waveguide tube 22 before the detector antenna 116. Due to the fact that the electron spins are excited by only circular polarization with respect to the magnetic field direction, circularly polarizing the incident electromagnetic energy within the cavity 10 and linearly polarizing it prior to the detector antenna 116 in principle can lead to a four-fold increase in signal power.

Figure 2:
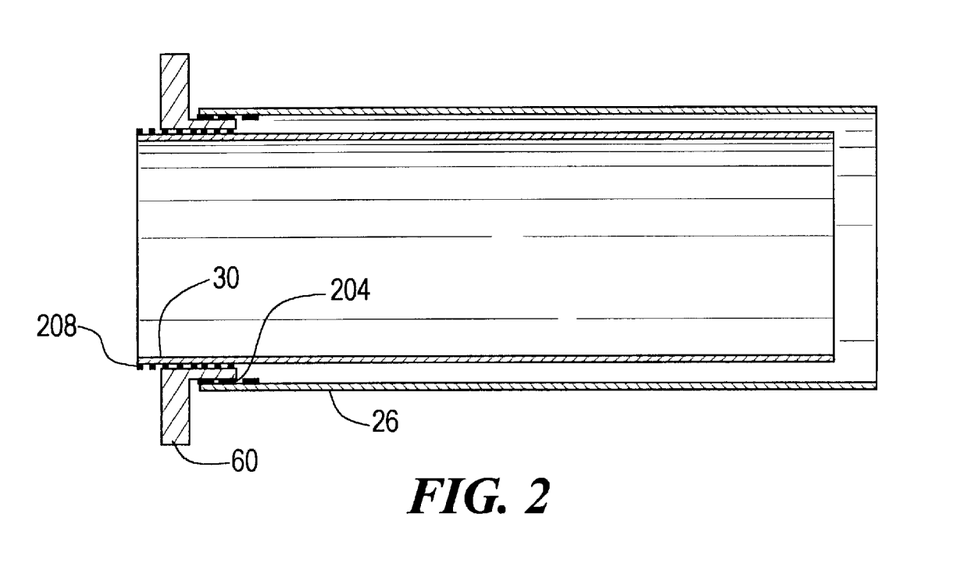
FIG. 2 is a diagram of an embodiment of adjustment rings for the apparatus of FIG. 1A.

Considering the components in more detail, FIG. 2 depicts the general structure of the adjustment rings used to adjust and maintain the tubes within other tubes, such as adjustment ring 60 disposed between the source waveguide tube 30 and the coupling mirror support tube 26 shown in FIG. 1A. The ring 60 is mounted to an inner tube 30 on threads 208 so that rotation of the ring 60 does not result in rotation of the inner tube 200. The outer tube 26 includes a threaded portion 204 with a larger pitch than the threads 208 which engages the surface of adjustment ring 60. Rotation of ring 60 results in coaxial displacement of the inner tube 30 with respect to the outer tube 26. In one embodiment, the threads 208 are cut at 32 threads/inch and the threads 204 are cut at 20 threads/inch, therefore, turning the adjustment ring 60 one full turn adjusts the longitudinal position of tube 30 within tube 26 by about 961 microns. In one embodiment, the adjustment rings are made from a self-lubricating polymer. In another embodiment, the rings are made from a non-magnetic metal.

Figure 4:
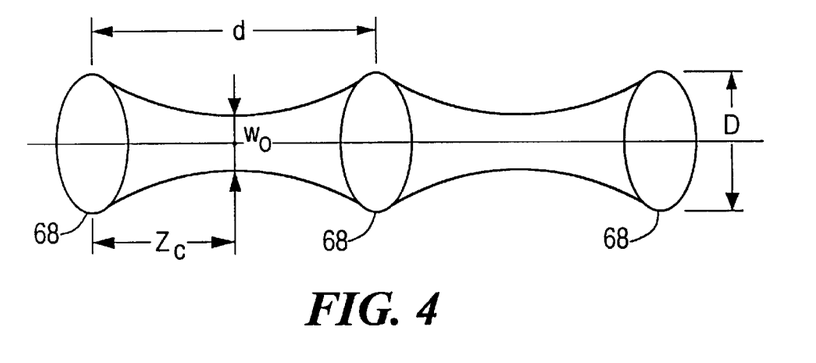
FIG. 4 is a schematic diagram of the propagation of a gaussian beam by a series of lenses depicted in FIG. 1.

Referring to FIG. 4, the series of symmetric dielectric lenses (generally 68 and 112) permits the microwave radiation reaching the sample holder 92 from the antenna 76 and reaching the detector antenna 116 from the sample holder 92 to propagate in a free space gaussian beam mode. A gaussian beam is a modified plane wave whose amplitude decreases in a radial direction from the central axis of the beam. The simplest gaussian beam has a radial intensity function described by the equation:

$$I = I_o \exp(-\rho^2/w_o^2)$$

where $\rho$ is the radial distance from the central axis of the beam and $w_o$ is the distance at which the intensity drops to $(1/e)$ times the value, $I_o$, at the central axis.

The maximum distance between two focussing elements for a gaussian beam is twice the confocal distance, $Z_c$, of the lens. Thus the distance, d, between the lenses is:

$$d = 2z_c$$

At the confocal distance, the microwave radiation passing through the lens forms a narrow waist of diameter $w_o$. Beyond the confocal distance, the microwave radiation beam begins to spread again and must be refocussed by another lens. The relationship between the confocal distance $z_c$ and the beam waist, $w_o$ is:

$$z_c = (\pi w_o^2)/\lambda$$

where $\lambda$ is the wavelength of the radiation beam. The diameter D of the waveguide must be large compared to the beam waist in order to avoid aperture effects, such as diffraction or mode conversion to modes not propagated by the lenses. In general, if the beam diameter, w, at the lens satisfies the equation:

$$w < D/4$$

the aperture effects will be minimal.

$$w = 2^{1/2} w_o$$

at the confocal distance $z_c$. Therefore, $$d \leq (\pi D^2)/(16\lambda)$$

Thus with this distance between the lenses, the beam is refocussed by each succeeding lens. It must be kept in mind that each lens adds some signal loss and as such, if it is possible to relax the constraints on the diameter of the waveguide, it might be possible to reduce the number of lenses required to span the length of the waveguide.

In one embodiment, the diameter of the lens aperture is 25.4 mm, the distance from the source to the lens adjacent the sample is 332 mm, and the frequency of the radiation beam is 220 GHz. In this embodiment, four lenses are needed to cover the 332 mm distance of the waveguide. However, if the waveguide diameter is increased to 27.7 mm, the same distance could be covered using three lenses, thus avoiding the cost of the lens and the losses associated with the extra lens.

Figure 5:
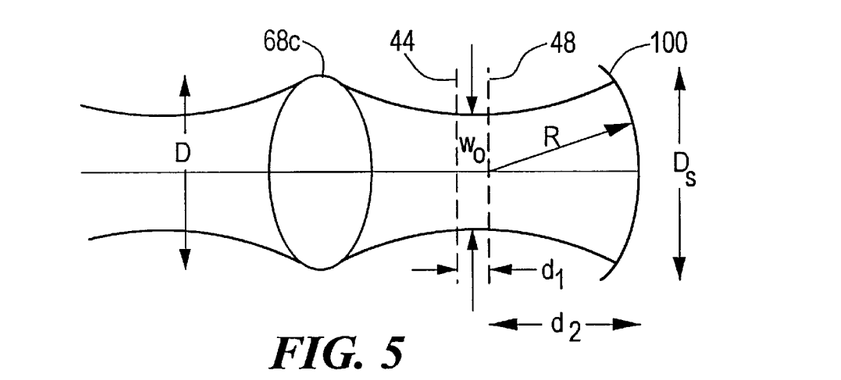
FIG. 5 is a schematic diagram of the variable coupling of the gaussian beam by the semiconfocal Fabry-Perot sample cavity depicted in FIG. 1.

Referring to FIG. 5, the gaussian beam mode permits the maximum coupling of the radiation beam and the back mirror 100. When properly positioned, the back mirror 100 and the two partially reflecting mirrors 44, 48 form two back-to-back Fabry-Perot interferometers sharing a common partially reflective mirror 48. The interferometer consisting of the two partially reflecting mirrors 44, 48 can be treated as a single mirror having an adjustable reflectance. By properly adjusting the relative positions of the partially reflective mirrors 44, 48 and the back mirror 100 and by choosing the proper reflectivity for the back mirror 100 and the reflectance of the planar mirror Fabry-Perot interferometer, a resonance cavity is created about the sample holder 92. The resonant cavity therefore causes the sample to be exposed to an increased electromagnetic field intensity without requiring an increase in the output power of the microwave generator.

The confocal Fabry-Perot interferometer is arranged to balance two competing effects. The first effect is termed walk-off loss and is the divergent scattering of light as it is reflected between the two partially reflecting mirrors. This reflective loss is minimized by widening the beam waist with respect to the mirror aperture. The competing effect is that concentrating the field results from narrowing the beam waist. Hence, although the microwave beam can be concentrated at the sample by focussing, such focussing increases the walkoff losses in the Fabry-Perot interferometer due to divergent scattering.

The sensitivity of a spectrometer is proportional to the finesse of the confocal Fabry-Perot interferometer. The finesse of the confocal Fabry-Perot interferometer increases as a function of mirror reflectivity. However, higher mirror reflectivities require larger beam waists with resulting smaller magnetic field intensities. To balance these opposing effects, if the relationship between the beam waist, $w_o$, and the reflectivity of the planar mirrors, $R_m$, given by the expression:

$$w_o \geq 0.2 \sqrt{\frac{4\pi d_1 \lambda}{(1-R_m)}}$$

where $d_1$ is the spacing between the partially reflective planar mirrors, $\lambda$ is the wavelength of the source electromagnetic radiation and $R_m$ is the reflectivity of the planar mirrors, the loss will be less than or equal to 1 dB. Thus, the two mirrors of the Fabry-Perot interferometer are treated as a single mirror whose reflectance affects the total reflectance of the cavity. The spacing, $d_1$, between the partially reflective planar mirrors is $3\lambda/2$, which is about 2.04 mm for a 220 GHz frequency source.

The back mirror 100 should be placed such that its center is at the confocal distance, $z_c$, from the cavity beam waist as given by the expression:

$$z_c = (\pi w_o^2)/\lambda$$

as discussed above. The radius of curvature for the mirror is $2z_c$ and the diameter of the back mirror 100 is 4 times the diameter, w, of the beam at the back mirror 100, as discussed above.

Figure 6:
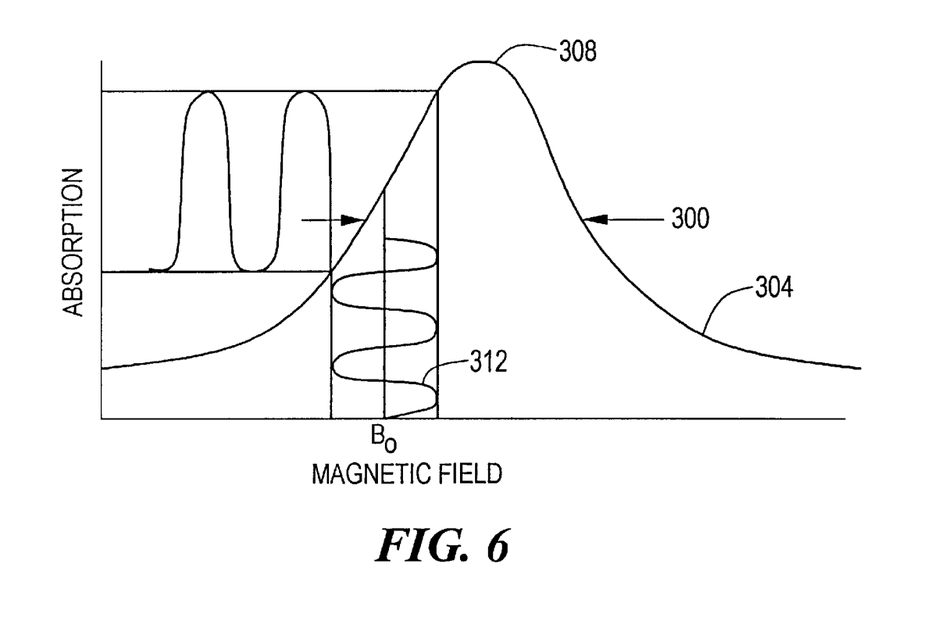
FIG. 6 is an illustrative sample absorption curve for the embodiment of FIG. 1.

To utilize the resonant cavity to perform measurements on a sample, the sample holder 92 is positioned within the homogeneous field region of the main electromagnetic coil 34. The cavity must first be tuned to resonance. The microwave generator is set to provide a 220 GHz output which is modulated as a square wave at a frequency of approximately 100 Hz. The position of coupling mirror support tube 26 within the alignment tube 14 is adjusted until the peak width 300 of the absorption peak of the absorption curve of the sample is minimized (FIG. 6). The position of the detector waveguide tube 22 within the alignment tube 14 is adjusted until the peak height 308 of the absorption curve of the sample is maximized. The resonance cavity is thus tuned. Once the resonance cavity has been tuned, the microwave generator is set to output a low-noise continuous-wave power at 220 GHz. In order to obtain a spectrum, an AC current at a single frequency between 5–100 KHz is passed through the modulation coils. The signal from the receiver 120 is monitored and filtered at the modulation frequency by a lock-in amplifier as the field supplied by the sweep magnet 36 is changed.

In the case where a sample being measured contains orientationally ordered molecules, such as a crystal, the sample may be rotated inside the spectrometer. This rotation of the sample is performed by the implementation of a geared sample mount. The control rod 95 is coupled via a rack gear to the tube or rod sample holder 92 such that translation of the rod 95 results in rotation of the sample holder 92. Thus, the sample holder 92 can be rotated around one axis perpendicular to the spectrometer field.

In certain instances the sample may be need to be illuminated. The illumination of the sample is accomplished by introducing an external light 124 through a light tube 128 which extends into an area proximate the sample holder. A prism 140 disposed adjacent the end of the light tube 128 reflects the light in to the sample holder 92. The sample holder 92 will be provided with a clearance hole or dielectric window that is aligned with the prism 140.

The sample being measured may need to be temperature controlled. Heated or cooled gas is flowed through the sample area via a cooling tube 94 and an exhaust tube 94*a*, thereby providing the necessary cooling or heating of the sample being measured.

Figure 7:
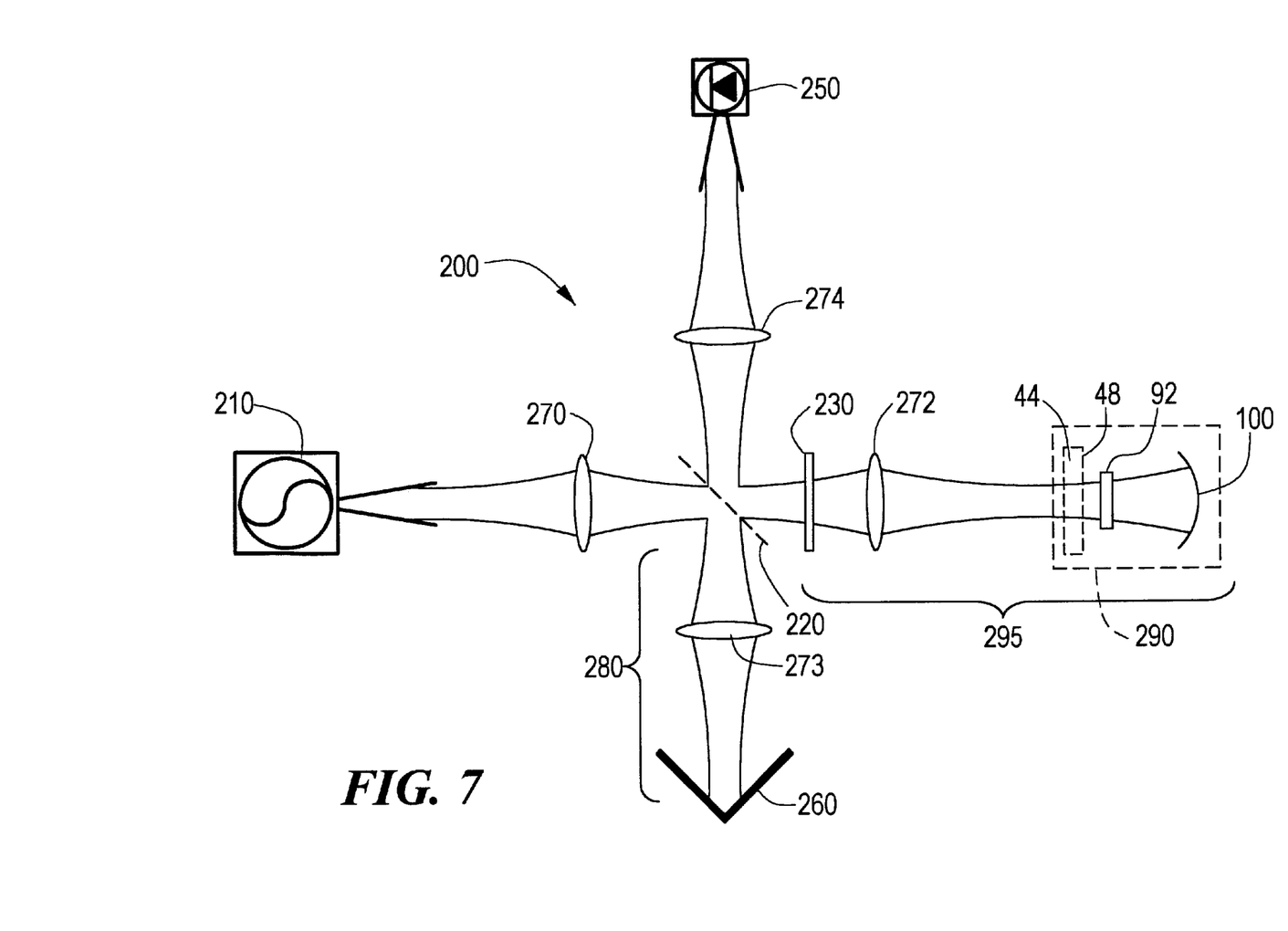
FIG. 7 is a diagram of the sample chamber as part of a Martin-Puplett polarizing interferometer.

Referring now to FIG. 7 an embodiment in which the variable coupling cavity 290 of the present invention is incorporated into a Martin-Puplett polarizing interferometer 200 is shown. A light source 210 provides vertically polarized light through lens 270 to a wire grid 220, angled at 45 degrees. The grid acts as a beam splitter with a portion of the polarized light at +45 degrees being reflected into reference arm 280. This reflected light beam travels through lens 273, then to rooftop mirror 260. The light exiting the rooftop mirror has been rotated 90 degrees, and is now at −45 degrees. The light is reflected back through the lens 273, and is transmitted through grid 220. The light that passed through wire grid 220 is at −45 degrees as it enters the sample arm 295. The light passes through quarter wave plate 230 where it becomes positively circularly polarized, through lens 272 and into the variable coupling cavity 290. The quarter wave plate 230 could be replaced with a second Martin-Puplett interferometer or polarization-transforming reflector. The light passes through partially reflective mirrors 44 and 48, through sample holder 92 where the light is affected by the sample. The light is then reflected back through the sample holder and partially reflective mirrors 44 and 48 by back mirror 100 as negatively circularly polarized light. The negatively circularly polarized then passes through lens 272, through quarter wave plate 230 where it becomes polarized at +45 degrees before being reflected by wire grid 220, where it becomes recombined with the light from the reference arm. This recombined light beam then passes through lens 274 and into detector 250 where the detected light is indicative of the material in sample holder 92. This arrangement allows phase discrimination of the sample signal by moving the rooftop mirror 260.

Figure 8:
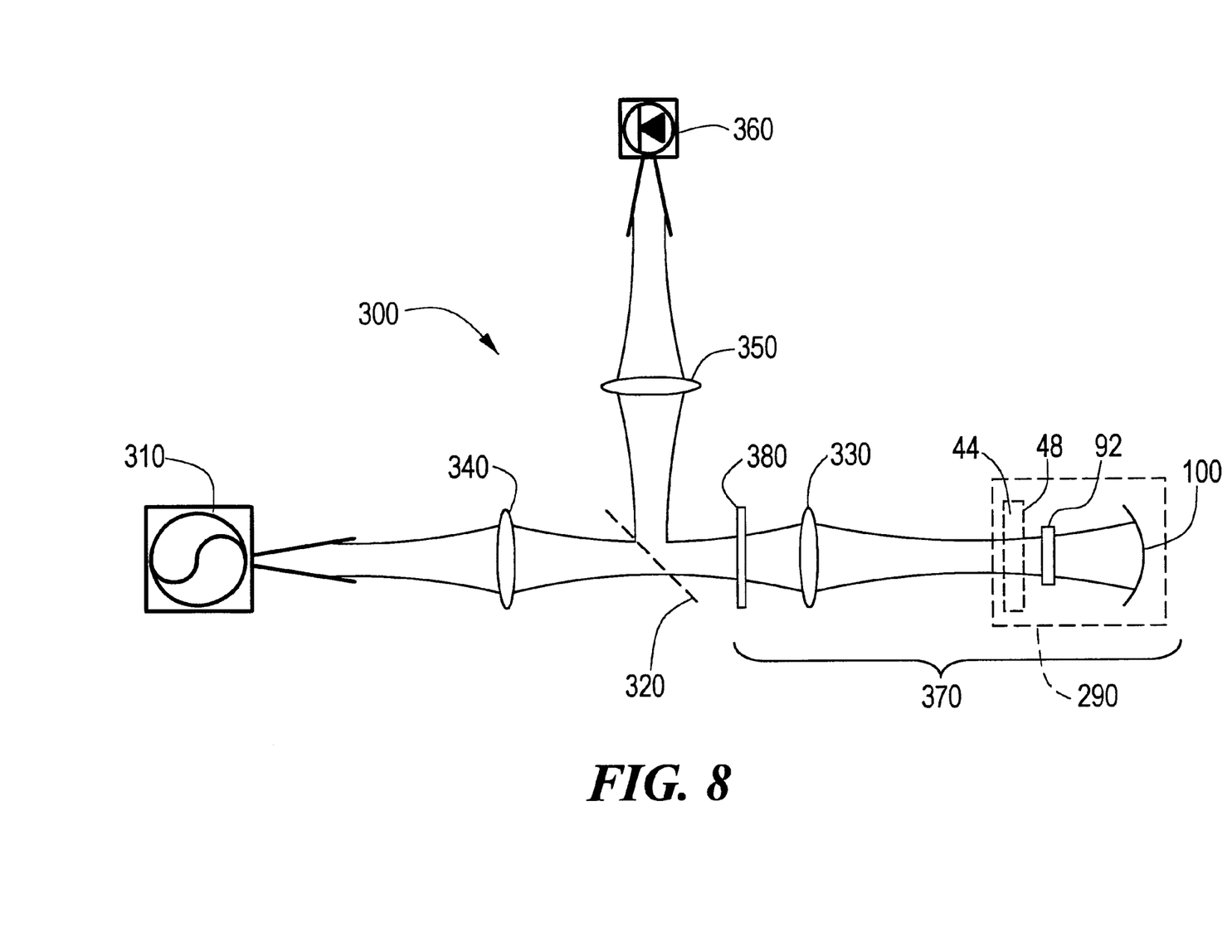
FIG. 8 is a diagram of the sample chamber as part of a Fabry-Perot interferometer.

Referring now to FIG. 8, an embodiment in which the variable coupling cavity 290 of the present invention is incorporated into a Fabry-Perot style interferometer 300 is shown. A light source 310 provides vertically polarized light through lens 340 to a horizontal wire grid 320. The light is transmitted by the grid and enters the sample arm 370. The light passes through quarter wave plate 380 where it becomes positively circularly polarized, through lens 330 and into the variable coupling cavity 290. The quarter wave plate 380 could be replaced with a Martin-Puplett interferometer or polarization-transforming reflector. The light passes through partially reflective mirrors 44 and 48, through sample holder 92 where the light is effected by the sample. The light is then reflected back through the sample holder and partially reflective mirrors 44 and 48 by back mirror 100 as negatively circularly polarized light. The negatively circularly polarized light then passes through lens 330, through quarter wave plate 380 where it becomes vertically polarized before being reflected from wire grid 220 through lens 350 and into detector 360 where the detected light is indicative of the material in sample holder 92. This arrangement does not allow phase discrimination of the sample signal.

The wire grid 220 and 320 of FIGS. 7 and 8 could also be realized in the form of a Faraday rotator. The Faraday rotator consists of a permanently magnetized ferrite sheet with quarter wavelength dielectric matching, and acts as a quasi-optical circulator. Additionally, the quarter wave plates could be realized in the form of a polarization-transforming reflector (PTR). The PTR performs its polarization transformation with a grid polarizer and a flat mirror, thus introducing a phase shift between orthognal components of the Gaussian beam.

Reference has been made to a controller and power supplies 72 of FIG. 1A. In one embodiment of the presently disclosed invention, this controller is a personal computer (PC) having an interface to an instrument bus, the latter providing a link between the PC and the elements under its control. The controller 72 provides at least four preferred functions. First, the controller 72 has a lock-in amplifier providing analog-to-digital (A/D) conversion functions, which enables modulation at the resonance field by providing current to the Helmholtz coils 66 at a selected frequency, and further enables the measurement of the EMR signal at the same frequency, as well as the sweep magnet current. Second, the controller 72 has a digital I/O port which provides binary signals used for switching. Examples include turning source power on and off, commanding the microwave source into tune mode and detecting error or fault conditions. Third, a programmable power supply is provided to control current supplied to the sweep coil 36. In a further embodiment, this programmable power supply is a four-quadrant supply especially suitable for superconducting magnets. Fourth, motor drive interfaces for stepper motors controlling waveguide lateral position are provided in the controller 72 by rotating the adjustment rings 52, 58, 60.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

We claim:

1. A spectrometer comprising:

first and second substantially parallel, partially reflective mirrors, a distance between said first and second mirrors being adjustable, said first and second mirrors configured as a first interferometer; and a third mirror adjustably positioned adjacent said second mirror and configured to form a second interferometer with said second mirror, said first interferometer and said second interferometer forming a resonance cavity for said spectrometer.

2. The spectrometer of claim 1 further comprising:

an alignment tube;

a detector waveguide tube movably positioned within and coaxial with said alignment tube, said third mirror enclosing one end of said detector waveguide tube;

a cavity flat mirror support tube movably positioned within and coaxial with said alignment tube, said second mirror enclosing one end of said cavity flat mirror support tube;

a coupling flat mirror support tube movably positioned within and coaxial with said cavity flat mirror support tube, said first mirror enclosing one end of said coupling flat mirror support tube; and a source waveguide tube movably positioned within and coaxial with said coupling flat mirror support tube, and wherein said detector waveguide tube, said first mirror, said second mirror, said third mirror and said source waveguide tube are movable with respect to one another for adjusting said resonance cavity.

3. The spectrometer of claim 2 wherein said source waveguide tube further comprises at least one dielectric lens, said dielectric lens maintaining electromagnetic radiation passing through said source waveguide tube in a gaussian mode.

4. The spectrometer of claim 3 wherein each of said at least one dielectric lens is separated from another of said at least one dielectric lens by a distance d, wherein $$d \leq (\pi D^2)/(16\lambda)$$

and wherein D is the diameter of said source waveguide and $\lambda$ is the wavelength of electromagnetic radiation passing along said source waveguide tube.

5. The spectrometer of claim 2 wherein said detector waveguide tube further comprises at least one dielectric lens, said dielectric lens maintaining electromagnetic radiation passing through said detector waveguide tube in a gaussian mode.

6. The spectrometer of claim 5 wherein each of said at least one dielectric lens is separated from another of said at least one dielectric lens by a distance d, wherein $$d \leq (\pi D^2)/(16\lambda)$$

and wherein D is the diameter of said detector waveguide and $\lambda$ is the wavelength of electromagnetic radiation passing along said source waveguide tube.

7. The spectrometer of claim 2 wherein said source waveguide tube comprises a corrugated waveguide.

8. The spectrometer of claim 2 wherein said detector waveguide tube comprises a corrugated waveguide.

9. The spectrometer of claim 2 further comprising a sample support tube positioned within and coaxial with said alignment tube, said sample support tube having a sample holder enclosing one end of said sample support tube.

10. The spectrometer of claim 9 wherein said detector waveguide tube is movably positioned within and coaxial with said sample support tube.

11. The spectrometer of claim 2 further comprising a first quarter wave plate disposed within said source waveguide tube and a second quarter wave plate disposed within said detector waveguide tube.

12. The spectrometer of claim 9 wherein said sample holder is selected from the group consisting of a tube holder, a flat tissue cell holder, a film holder and a bulk optical holder.

13. The spectrometer of claim 9 further comprising a control rod coupled to said sample holder for rotation of said sample holder about a central longitudinal axis within said spectrometer, said control rod extending from outside said spectrometer to said sample holder.

14. The spectrometer of claim 9 further comprising a light tube extending from outside said variable coupling quasioptical electron resonance apparatus to a location adjacent said sample holder.

15. The spectrometer of claim 9 further comprising a cooling tube extending from outside said variable coupling quasioptical electron resonance apparatus to a location adjacent said sample holder.

16. The spectrometer of claim 9 further comprising an exhaust tube extending from outside said variable coupling quasioptical electron resonance apparatus to a location adjacent said sample holder.

17. The spectrometer of claim 1, wherein said first interferometer is a Fabry-Perot interferometer.

18. The spectrometer of claim 1, wherein said second interferometer is a semiconfocal Fabry-Perot interferometer.

19. The spectrometer of claim 1, wherein said second interferometer is a planar Fabry-Perot interferometer.

20. The spectrometer of claim 1 further comprising:
a first mirror support tube supporting said first mirror;
a second mirror support tube disposed coaxial with said first mirror support tube and supporting said third mirror; and
a plurality of symmetric propagation lenses disposed at predetermined locations within said first mirror support tube and said second mirror support tube.

21. The spectrometer of claim 1 further comprising:
a first mirror support tube supporting said first mirror; and
a second mirror support tube disposed coaxial with said first mirror support tube and supporting said third mirror, wherein said first mirror support tube and said second mirror support tube comprise corrugated waveguides.

22. The spectrometer of claim 1 wherein said first partially reflective mirror and said second partially reflective mirror comprise a mesh of material selected from the group consisting of gold, silver, copper, nickel, mylar, teflon, quartz, polymethyl pentene, polystyrene and sapphire.

23. The spectrometer of claim 1 wherein said first partially reflective mirror and said second partially reflective mirror comprise an inverse mesh of material selected from the group consisting of gold, silver, copper, nickel, mylar, teflon, quartz, polymethyl pentene, polystyrene and sapphire disposed on a substrate.

24. The spectrometer of claim 1 wherein said alignment tube and said source waveguide tube are comprised of non-magnetic material.

25. The spectrometer of claim 1 further comprising:
a microwave or millimeter wave generator;
a wire grid in communication with said wave generator;
a sample holder disposed within said resonance cavity and in communication with said wire grid;
a quarter wave plate disposed between said wire grid and said sample holder; and
a microwave or millimeter wave receiver in communication with said wire grid.

26. The spectrometer of claim 25 further comprising a rooftop mirror in communication with said wire grid, said rooftop mirror adjustable with respect to said wire grid.

27. The spectrometer of claim 25 wherein said quarter wave plate comprises a Martin-Puplett interferometer.

28. The spectrometer of claim 25 wherein said quarter wave plate comprises a polarization-transforming reflector.

29. The spectrometer of claim 25 wherein said quarter wave plate is replaced by a 45 degree Faraday rotator.

30. The spectrometer of claim 25 further comprising:
a first lens disposed between said wire grid and said wave generator;
a second lens disposed between said wire grid and said sample holder; and
a third lens disposed between said wire grid and said wave detector.

31. The spectrometer of claim 26 further comprising a lens disposed between said rooftop mirror and said wire grid.

32. A variable coupling quasioptical electron resonance apparatus comprising:
an alignment tube having a first end and a second end;
a sample support tube having a first end and a second end, disposed internal and coaxial with said second end of said alignment tube;
a first mirror support tube disposed internal and coaxial with the first end of said alignment tube;
a second mirror support tube disposed internal and coaxial with said first mirror support tube and the first end of said alignment tube;
a source waveguide tube disposed internal and coaxial with said first and second mirror support tubes;
a detector waveguide tube disposed internal and coaxial with the second end of said sample support tube;
a mirror support tube adjustment ring disposed between said first mirror support tube and said alignment tube, for providing relative displacement of said first mirror support tube with respect to said alignment tube;
a mirror waveguide adjustment ring disposed between said first mirror support tube and said second mirror support tube, for providing relative displacement of said second mirror support tube with respect to said first mirror support tube;
a source waveguide adjustment ring disposed between said source waveguide tube and said second mirror support tube, for providing relative displacement of said source waveguide with respect to said second mirror support tube;
a sample waveguide adjustment ring disposed between said sample waveguide tube and said alignment tube for providing relative displacement of said sample waveguide tube with respect to said alignment tube;
a detector waveguide adjustment ring disposed between said sample waveguide tube and said detector waveguide tube for providing relative displacement of said sample waveguide tube with respect to said detector waveguide tube;
a spectrometer comprising:
a first partially reflective mirror enclosing one end of said first mirror support tube;
a second partially reflective mirror enclosing one end of said second mirror support tube, said first and second mirrors configured as a first interferometer, a distance between said first partially reflective mirror and said second partially reflective mirror adjustable by rotation of said mirror waveguide adjustment ring; and
a third mirror enclosing said detector waveguide tube, configured to form a second interferometer with said first mirror, a distance between said third mirror and said first mirror being adjustable, said first interferometer and said second interferometer forming a resonance cavity for said spectrometer;

a sample holder enclosing one end of said sample support tube, a distance between said sample holder and said third mirror adjustable by rotation of said detector waveguide tube adjustment ring;

a microwave or millimeter wave generator in communication with an end of said source waveguide tube;

a plurality of symmetric propagation lenses disposed at predetermined locations within said source wave guide tube and said detector waveguide tube;

a microwave or millimeter wave receiver in communication with an end of said detector waveguide tube;

a magnetic coil surrounding a portion of said alignment tube;

a sweep coil surrounding a portion of said magnetic coil;

a plurality of modulation coils surrounding said sample holder; and a controller in communication with said microwave generator, said microwave receiver, said sweep coil, said modulation coil and said magnetic coil.

33. The variable coupling quasioptical electron resonance apparatus of claim 32 further comprising a cryostat disposed abut said magnetic coil.

34. The variable coupling quasioptical electron resonance apparatus of claim 32 further comprising:

a horn antenna disposed between said microwave or millimeter wave generator and the first end of said source wave guide tube, and in communication with said microwave or millimeter wave generator; and an asymmetric entrance lens disposed with its convex side toward said horn antenna, adjacent the first end of said source waveguide tube.

35. The variable coupling quasioptical electron resonance apparatus of claim 32 further comprising an antenna disposed between said microwave or millimeter wave generator and the first end of said source waveguide tube.

36. The variable coupling quasioptical electron resonance apparatus of claim 32 wherein said microwave or millimeter wave generator provides a signal having a frequency of approximately 220 GHz.

37. The variable coupling quasioptical electron resonance apparatus of claim 32 wherein said modulation coils comprise helmholtz coils.

38. The variable coupling quasioptical electron resonance apparatus of claim 32 wherein said modulation coils comprise solenoid coils.

39. The variable coupling quasioptical electron resonance apparatus of claim 32 wherein said magnetic coil is configured to provide a magnetic field having a strength of approximately 7.9 Tesla.

40. The variable coupling quasioptical electron resonance apparatus of claim 32 wherein said sweep coil is configured to provide a sweepable magnetic field having a strength of approximately ±0.05 Tesla.

41. The variable coupling quasioptical electron resonance apparatus of claim 32 wherein said modulation coils are configured to provide a modulated magnetic field having a strength of approximately ±0.005 Tesla.

42. The variable coupling quasioptical electron resonance apparatus of claim 41 wherein said modulation coils are modulated at a frequency between approximately 5 KHz and 100 KHz.

43. The variable coupling quasioptical electron resonance apparatus of claim 32 wherein said mirror waveguide adjustment ring, said source waveguide adjustment ring, said sample waveguide adjustment ring and said detector waveguide adjustment ring each comprise an element selected from the group consisting of a self-lubricating polymer and a non-magnetic metal.

* * * * *